United States Patent [19]

Redel et al.

[11] 4,315,195
[45] Feb. 9, 1982

[54] HIGH-VOLTAGE SUPPLY FOR POWER ELECTRON-BEAM GUNS

[75] Inventors: Karl-Georg Redel, Rodenbach; Gerd Deppisch, Aschaffenburg, both of Fed. Rep. of Germany

[73] Assignee: Leybold Heraeus GmbH, Rodgau, Fed. Rep. of Germany

[21] Appl. No.: 147,447

[22] Filed: May 7, 1980

[30] Foreign Application Priority Data

May 8, 1979 [DE] Fed. Rep. of Germany ....... 2918426

[51] Int. Cl.³ .................... H05B 7/148; H02H 7/20
[52] U.S. Cl. .................................. 315/107; 315/127; 315/205; 315/243; 315/340; 328/8
[58] Field of Search ........ 315/107, 127, 205, 243–245, 315/289, 291, 340; 328/8, 9; 361/111, 113; 219/121 EB; 250/492 B

[56] References Cited

U.S. PATENT DOCUMENTS

| | | | |
|---|---|---|---|
| 3,689,798 | 9/1972 | Brukovsky et al. | 219/121 EB X |
| 3,760,279 | 9/1973 | Rudolph | 328/8 |
| 3,909,663 | 9/1975 | Thomas et al. | 315/107 X |
| 3,938,001 | 2/1976 | Ota et al. | 315/107 X |

Primary Examiner—Eugene La Roche
Attorney, Agent, or Firm—Sprung, Felfe, Horn, Lynch & Kramer

[57] ABSTRACT

A high-voltage power supply for an electron-beam gun with a heatable cathode and an anode and of the type having an electronic switch connected in the current circuit for the cathode and controllable for blocking the current to the cathode, includes an impulse protecting filter connected in the current circuit for the cathode. The filter comprises a capacitor connected in parallel to the cathode, a choke connected in series with the cathode current circuit, a blocking diode and a discharge resistor connected in series therewith, with the diode and resistor connected in parallel with the choke.

4 Claims, 3 Drawing Figures

HIGH-VOLTAGE SUPPLY FOR POWER ELECTRON-BEAM GUNS

BACKGROUND OF THE INVENTION

The invention relates to a high-voltage supply means for power electron-beam guns with a heatable cathode and an anode, particularly for electron-gun vaporizers, with a high-voltage transformer, smoothing means for the residual waviness of the feed voltage, an electronic switching member, which is arranged in the current circuit to the cathode and a switching circuit which is controlled dependent on current and which cuts in to produce a blocking voltage for operating the switching member.

The expression "power electron-beam guns" is usually understood to mean such guns operating in a power range of between 2.0 and 300 kW. Depending upon gun capacity and application, high voltage supply means suitable for this purpose have an output voltage of between 4 and 150 kV. Because of the conditions affecting their use, such high-voltage supply means must be short-circuit proof, and this will be discussed in greater detail hereinafter.

Electron-beam guns of the stated kind are mainly operated in a vacuum, i.e. in a vacuum chamber, the vacuum being greater than $10^{-3}$ mbars. Under normal pressure and because of the inevitable collisions of the electrons with gas molecules, electron beams cannot travel distances appreciably greater than 20 to 25 mm. However, within the vacuum chambers in which the electron-beam guns are located, the above-mentioned collisions can cause ion formation which leads to voltage flash-over, i.e. to conditions resembling short-circuiting. The deposition of vapour on, and the contamination of, insulators and other voltage-carrying components, as promoted in a vacuum, can also lead to periodic short circuits in the high voltage system. A certain degree of resistance to short-circuiting can be achieved by switching off the high voltage as promptly as possible when a predetermined current-limit value is exceeded. After a likewise predetermined time, which is on the order of 20 to 1000 milliseconds, has elapsed, and which normally suffices for de-ionizing the discharge sections, voltage is restored by an automatic control means. Depending upon the construction of the high-voltage supply means, the switching-off operation can be carried out in various ways. This can be done, for example, by means of relays, electronic contactors or thyristors provided on the primary side of low-voltage side. On the high-voltage side it is possible to switch off by means of mercury tubes, or to limit the current with the aid of regulating tubes. The switching arrangements used for this purpose form part of the prior art and therefore do not need to be described in detail.

It has been found in practice that under certain unavoidable conditions, extremely "hard" short-circuits can occur in the current circuit in the vacuum chamber. The expression "hard" short-circuits will be understood as meaning such short circuits as are characterized by a steep rise in current. For example, short-circuits have been measured in which the current downstream of the high-voltage filter capacitor used as the smoothing means has risen, in less than five microseconds, to values which were limited only by the internal resistance of the mercury tubes and the resistance of the high-voltage cables. The internal resistance of the current source corresponds in this case to the extremely low internal resistance of the charged filter capacitor. Within less than five microseconds, such current assumed 50 to 100 times the value of the nominal voltage of the supply means.

The above-mentioned discharges have quite a number of disadvantageous effects. Because of the steep rise in current, which reaches its maximum before the switching member present can block the current, there even occurs, in the case of high-voltage supply means having switching members consisting of mercury tubes, ionization phenomena in these tubes that can lead to their failure. It is no longer possible to switch off the supply means, so that the safety devices respond and/or the mercury tubes are destroyed. On the other hand, the described discharges cease immediately if insufficient energy is supplied for maintaining the discharge. A steep rise in current and likewise a steep drop in current which occurs when the discharge ceases to take place can cause marked reversals of impulses in adjacent leads because or magnetic induction, which reversals can lead to the destruction of other electrical components.

The problems occur principally in the case of high-voltage supply means having switching or current-limiting tubes arranged on the high-voltage side; however, they also play a part in the case of high-voltage supply means wherein relays or thyristors are arranged on the low-voltage side for the purpose of switching off.

SUMMARY OF THE INVENTION

The object of the present invention is, therefore, to provide a high-voltage supply means of the initially described kind wherein the steep rises and declines in current occurring with short-circuiting are avoided just as effectively as the occurrence of excess currents which amount to a multiple of the nominal current.

According to the invention and in the case of the initially described high-voltage supply means, this object is achieved in that an impulse protecting filter is arranged in the current circuit to the cathode, which filter consists of a capacitor, connected in parallel with the cathode/anode section, a choke, a free-running diode blocked in the direction towards the cathode, and a discharge resistor, the choke being connected in series with the cathode/anode section, and the free-running diode with the discharge resistor connected in series being connected in parallel with the choke.

Not only is the above-stated object fully and satisfactorily met by the above-mentioned features, but the impulse protecting filter in accordance with the invention excercises a twofold effect. In the case of "hard" short-circuits, it prevents a sufficient supply of energy, so that in many cases ionization is eliminated before the switching member blocks. In this case blocking is no longer necessary. In the case of lengthy ion discharges or short-circuits, dangerously high and steep current rise in the high voltage circuit is prevented until the switching element is blocked. The energy stored in the choke in this case is dissipated through the free-running diode with the discharge resistor connected in series.

The impulse-protecting filter can be arranged both upstream and downstream of the switching member. In the first case, the filter capacitor which is present in any case and is designed to have a considerably higher capacitance is also part of the impulse-protecting filter. However, it is particularly advantageous to arrange the impulse-protecting filter as close as possible to the electron-beam gun and therefore downstream of the switching member.

BRIEF DESCRIPTION OF THE DRAWINGS

A form of construction of the subject-matter of the invention will now be described by reference to the drawings, in which.

DETAILED DESCRIPTION OF THE INVENTION

Figure 1:
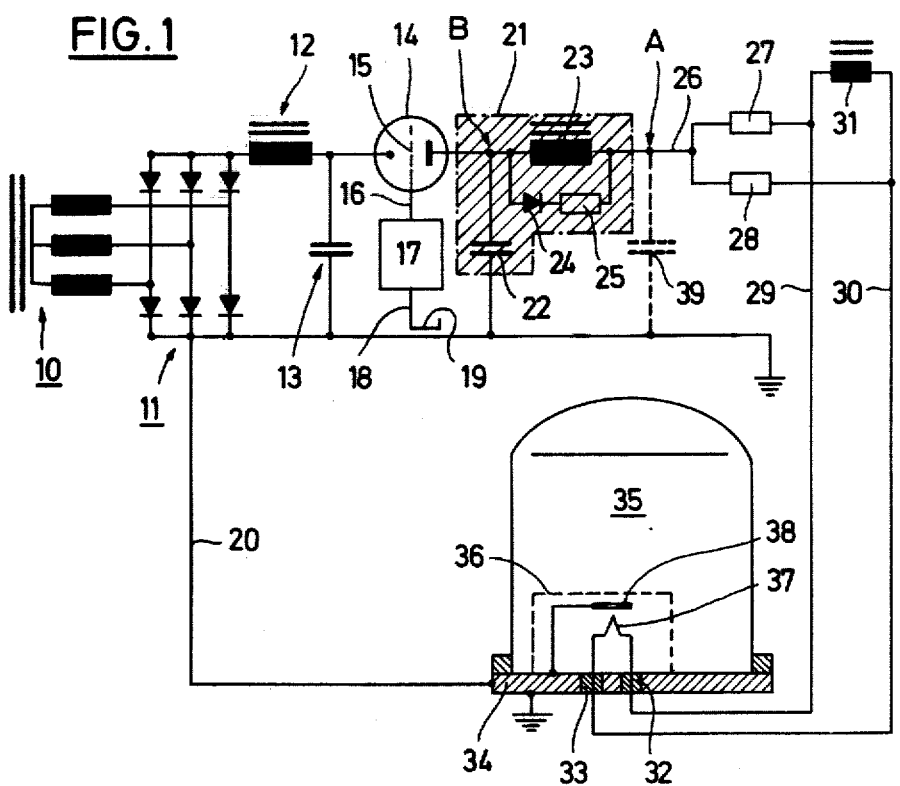
FIG. 1 shows a circuit arrangement for a high-voltage supply means in conjunction with a vacuum vapour-depositing installation having an electron-beam vaporizer.

FIG. 1 illustrates only the secondary side of a high-voltage transformer 10, which side is connected to a high-voltage rectifier 11. Connected to the output of the high-voltage rectifier 11 are smoothing means which consist of a filter choke 12 and a capacitor 13. The residual waviness in the high-voltage emanating from the mains frequency is substantially smoothed out by said smoothing means. Also arranged in the circuit is a switching member 14 which is designed as a mercury tube and has a control grid 15. By way of a lead 16, this control grid is connected to a switching circuit 17, from which a lead 18 runs to a transducer 19, which picks up the current which flows to the consumer unit (electron-beam vaporizer) or through the switching member 14 and which also flows through a lead 20 which connects one of the outputs of the high voltage rectifier 11 to ground.

The switching circuit 17 is so designed that, upon the occurrence of an excess voltage which is more than 1.2 times the value of the nominal current, the control grid 15 is brought, within an adjustable period of 10 to 50 microseconds, to a negative voltage of such magnitude compared with the cathode of the mercury tube, that the latter is blocked. The switching circuit 17 removes the block after an adjustable time of 50 to 700 milliseconds has elapsed.

Arranged downstream of the switching member 14 is an impulse-protecting filter 21, the components of which are disposed within the hatched zone. It consists of a capacitor 22 having a capacitance 2000 to 4000 pF, of a choke 23, the inductance which ranges from 0.1 to 1.0 Hy, of a free-running diode 24 connected to be blocked in the direction of the cathode, and a discharge resistor 25.

As previously stated, it is also possible to arrange the impulse-protecting filter upstream of the switching member 14 so that the capacitor 22 is replaced by the capacitor 13 (filter capacitor), the capacitance of which is designed to be correspondingly higher.

In the illustrated example, the output of the choke 23 is connected, by way of the lead 26, to two parallel-connected balancing resistors 27 and 28, which are connected to two leads 29 and 30 which are connected to a heating transformer 31, of which only the secondary side, connected to high voltage, is illustrated. By means of bushing insulators 32 and 33, leads 29 and 30 pass through a grounded base plate 34 of a vacuum chamber 35 in which is arranged an electron-beam vaporizer 36 which is merely illustrated in broken lines. Important parts of this vaporizer are the heatable cathode 37, connected to the negative high-voltage potential, and the anode 38, which serves to accelerate the electrons emitted from the cathode 37 and which is arranged at earth potential. By means of the balancing resistors 27 and 28, a high voltage is superposed on the (low) heating voltage of the heating transformer 31. The details of the electron-beam vaporizer 36 form part of the prior art and are described, for example, in DE-PS 22 06 995.

The capacitor 39, shown in broken lines, incorporates, as shown in the replacement circuit diagram, the effective capacitance of all grounded components connected to high-voltage potential, this being shown at the place marked "A" in the circuit arrangement. Depending upon the length of the leads 29 and 30 and the nature of the heating transformer 31, the capacitance of the system is between 1500 and 4000 pF.

Figure 2:
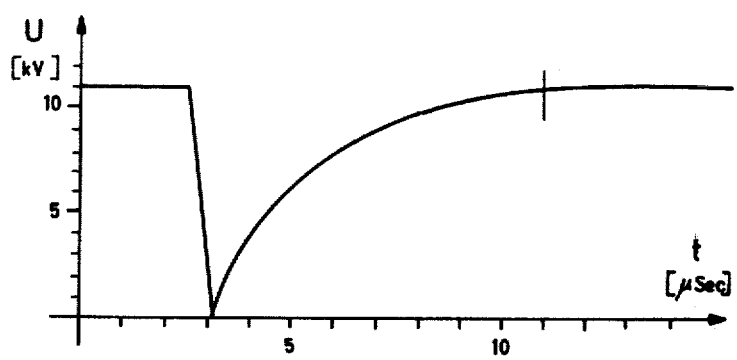
FIG. 2 is a graph in which change in voltage is illustrated from the moment of the occurrence of a hard short-circuit, through suppression of the discharge, to re-establishment of the voltage, without response by the switching member.

The mode of operation of the entire arrangement is as follows: if a "hard" short circuit which results in a steep rise in current occurs in the vacuum chamber 35 between the high-voltage carrying components and the earth potential, the current is first fed by the energy stored in the capacitance of the stated components (similar to capacitor 39). With a capacitance of 1500 to 4000 pF and a voltage of 12 kV, this energy amounts to 0.1 to 0.3 Watt-seconds. This means that within microseconds, current strengths on the order of magnitude of several hundred Amperes can occur. Measurements using a cathode-beam oscillograph have shown that at the place A and with such short-circuits, the voltage drops to zero in less than five microseconds (FIG. 2). The entire high voltage is then applied to the choke 23. The rise in current at the choke is $L \times U \times 10^{-6}$ A/sec $10^{-6}$. Only when the iron core of the choke 23 has reached a state of saturation does any steeper rise occur. This means that, depending upon the inductance rating of the choke 23, the current increase is between 0.01 and 0.1 A/sec $10^{-6}$.

In many cases of hard short-circuits, the current that continues to flow through the choke 23 does not suffice to maintain the existing discharge and this dies out as soon as the energy stored in the system (such as the capacitor 39) is used up. This process does not manifest itself outwardly but it can be detected by means of a cathode-ray oscillograph connected at the point A. The change in voltage concerned is illustrated in FIG. 2. At the point in the circuit arrangement indicated by the letter "B", no or practically no effect can be seen since the rise in current in the choke 23 is only slight, and the condenser 22 has only a brief stabilizing effect.

The probability that ionization in the vacuum chamber 35 is immediately eliminated again is increased if the capacitance of the system (such as the capacitor 39) is kept low. In the case of fairly great distances, e.g. when use is made of a double-core cable more than 4 m in length it is therefore expedient to place the impulse-protecting filter 21 together with the heating transformer 31 and the balancing resistors 27 and 28 in the immediate vicinity of the vacuum chamber 35.

As mentioned above, discharges or short-circuits in the vacuum chamber 35 also occur and these are not immediately eliminated. In this case, the following cycle takes place as regards the impulse-protecting filter 31. Voltage drops to zero at point A. In the choke 23, the current rises at a rate of 0.01 to 0.1 A/μsec. As soon as 1.2 times the value of the nominal current of the high-voltage supply means is reached in the choke 23, the circuit 17 responds after a delay of 10 to 50 μsec and applies to the control grid 15 a correspondingly high blocking voltage which blocks the switching member 14. As regards the various components, it is of importance that the blocking of the switching member 14 should become effective before the current in the choke 23 causes saturation of the choke. In this way it is ensured that the switching member 14 is not overloaded and remains capable of functioning.

At the moment of blocking of the switching member 14, the choke 23 is loaded to a particular energy potential by the flowing current. To prevent the energy content of the choke 23 from being converted by the switching member 14 into a high-voltage impulse as a consequence of interruption of the current, the free-running diode 24 and the discharge resistor 25 are connected in the manner illustrated in FIG. 1. The free-running diode 15 is so rated that its blocking voltages correspond to the nominal voltage of the high voltage supply means. The discharge resistor 15 is so rated that the greater part of the energy of the choke fades away within the blocking time of the switching member 14, i.e. between 50 and 700 milliseconds. The different values depend upon the nature of the installation and the setting.

Figure 3:
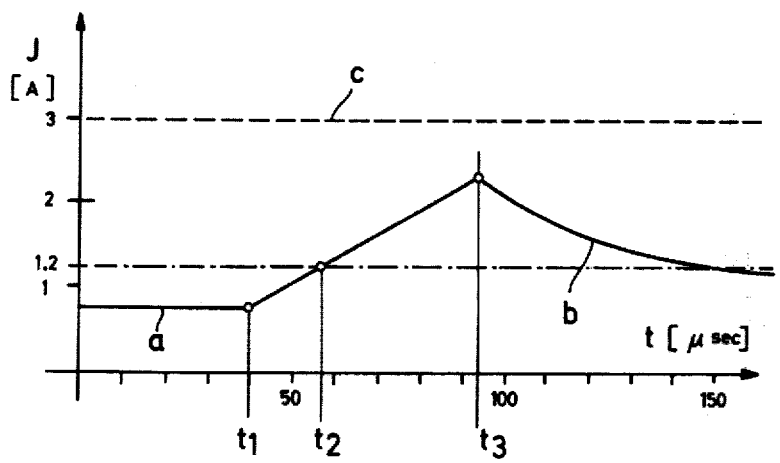
FIG. 3 is a diagram in which is shown the change in current upon the occurrence of a discharge of longer duration which is only eliminated by the response of the switching member.

The variation in the current at the point A is illustrated by means of the graph in FIG. 3. During trouble-free operation of the installation, the emission current of the cathode remains unchanged as indicated at a. At the moment $t_1$ a discharge process begins in the vacuum chamber 35, which process permits the current to rise in the manner indicated. At the moment $t_2$, the switching circuit 17 responds as a result of the preselected setting and blocks the switching member 14 at the moment $t_3$. The choke 23 then begins to discharge. The flowing current is indicated by the curved portion b of the graph. The saturating current of the choke is indicated by the broken horizontal line c which passes through the ordinate value 3 A. It will be seen that the maximum value of the current remains at a satisfactory distance from the saturation current.

In the present case, the function of the impulse-protecting filter 21 has been described in connection with an example comprising a mercury tube as the switching member 14, for which it is preferred to use the subject-matter of the invention. The impulse-protecting filter can of course also be successfully used in connection with high-voltage supply means having other short-circuit switch-off devices. In one such case, a particularly advantageous effect is achieved by that function leading to a premature elimination of "hard" short-circuits. With discharges or short-circuits of longer duration it is not possible to prevent energy of the capacitor 13 from being discharged. In this case too, the choke 23 can trap current surges having a steep flank and so avoid damage. With supply means of this kind it is recommended that the choke 23 be of correspondingly greater dimensions and, instead of a straight air-gap, a stepped or inclined air-gap, for example, be provided in the iron core in order to ensure that change to the saturated state occurs gradually rather than suddenly.

We claim:

1. A high-voltage supply means for power electron-beam guns with a heatable cathode and an anode, particularly for electron-gun vaporizers, with a high-voltage transformer, smoothing means for the residual waviness of the feed voltage, an electronic switching member, which is arranged in the current circuit to the cathode and a switching circuit controlled dependent on current and which cuts in to produce a blocking voltage for operating the switching member, and an impulse protecting filter arranged in the current circuit to the cathode, which filter consists of a capacitor connected in parallel with the cathode/anode section, a choke, a free-running diode blocked in the direction towards the cathode, and a discharge resistor, the choke being connected in series with the cathode/anode section, and the free-running diode with the discharge resistor connected in series being connected in parallel with the choke.

2. A high-voltage supply means according to claim 1, wherein the impulse protecting filter is arranged downstream of the switching member.

3. In a high voltage power supply, for an electron beam gun with a heatable cathode and anode and of the type having electronic switching means connected in the current circuit for the cathode and controllable for blocking the current to the cathode, the improvement comprising: an impulse protecting filter connected in the current circuit for the cathode and comprising a capacitor connected in parallel to the cathode, a choke connected in series with the cathode current circuit, a blocking diode and a discharge resistor connected in series therewith, with the diode and resistor connected in parallel with the choke.

4. The power supply according to claim 3, wherein the filter is connected downstream of the switching means.

* * * * *